(12) United States Patent
Regev et al.

(10) Patent No.: US 10,084,570 B2
(45) Date of Patent: Sep. 25, 2018

(54) SYSTEM AND METHOD FOR LINE CODING

(71) Applicant: ROCKLEY PHOTONICS LIMITED, London (GB)

(72) Inventors: Guy Regev, Pasadena, CA (US); Daniel Brunina, Pasadena, CA (US); Nathan Farrington, Arcadia, CA (US); Thomas Pierre Schrans, Temple City, CA (US)

(73) Assignee: ROCKLEY PHOTONICS LIMITED, London (GB)

(*) Notice: Subject to any disclaimer, the term of this patent is extended or adjusted under 35 U.S.C. 154(b) by 0 days.

(21) Appl. No.: 15/425,999

(22) Filed: Feb. 6, 2017

(65) Prior Publication Data

US 2017/0230143 A1    Aug. 10, 2017

Related U.S. Application Data (60) Provisional application No. 62/292,519, filed on Feb. 8, 2016.

(51) Int. Cl.
*H04B 1/38* (2015.01)
*H04L 27/00* (2006.01)
(Continued)

(52) U.S. Cl.
CPC ........ *H04L 1/0058* (2013.01); *G11B 20/1426* (2013.01); *H03M 5/145* (2013.01);
(Continued)

(58) Field of Classification Search
USPC .......... 375/219, 220, 221, 222, 240, 240.26, 375/240.27, 259, 285, 284, 295, 316, 346,
(Continued)

(56) References Cited

U.S. PATENT DOCUMENTS

| 4,486,739 A | 12/1984 | Franaszek et al. | |
|---|---|---|---|
| 5,396,239 A * | 3/1995 | McMahon | H04L 1/0042 341/58 |

(Continued)

FOREIGN PATENT DOCUMENTS

| WO | WO 02/47340 A1 | 6/2002 |
|---|---|---|
| WO | WO 2010/068126 A1 | 6/2010 |

OTHER PUBLICATIONS

International Search Report and Written Opinion of the International Searching Authority, dated May 12, 2017, Corresponding to PCT/EP2017/052750, 16 pages.

(Continued)

*Primary Examiner* — Linda Wong
(74) *Attorney, Agent, or Firm* — Lewis Roca Rothgerber Christie LLP (57) ABSTRACT

A system and method for line coding of data. A serial transmitter includes a forward error correction encoding circuit followed by a bit conditioning circuit. The bit conditioning circuit counts the lengths of runs of consecutive identical digits and, when the count reaches a threshold, flips a bit. A serial receiver receives the data from the serial transmitter. The serial receiver includes a forward error correction decoding circuit, which re-flips bits flipped by the bit conditioning circuit of the serial transmitter.

10 Claims, 5 Drawing Sheets

(51) Int. Cl.
*H04B 1/66* (2006.01)
*H04L 1/00* (2006.01)
*G11B 20/14* (2006.01)
*H03M 5/14* (2006.01)
*H04L 25/49* (2006.01)

(52) U.S. Cl.
CPC .......... *H04L 1/0041* (2013.01); *H04L 1/0042* (2013.01); *H04L 25/4915* (2013.01); *G11B 2020/1457* (2013.01)

(58) Field of Classification Search
USPC ................................ 375/347, 324, 340, 354
See application file for complete search history.

(56) References Cited

U.S. PATENT DOCUMENTS

| | | | |
|---|---|---|---|
| 5,625,644 A | 4/1997 | Myers | |
| 5,659,309 A * | 8/1997 | Takashi | G11B 20/10009 341/50 |
| 2007/0217312 A1* | 9/2007 | Newcomb | H04L 1/0041 369/59.13 |
| 2007/0280031 A1* | 12/2007 | Maejima | G11C 7/02 365/230.06 |
| 2012/0287173 A1* | 11/2012 | Guttag | G09G 3/34 345/690 |
| 2015/0063026 A1* | 3/2015 | Koudele | G11C 16/28 365/185.11 |
| 2015/0193298 A1* | 7/2015 | Ngo | G06F 11/08 714/758 |
| 2015/0380098 A1* | 12/2015 | Koudele | G11C 16/28 365/185.11 |
| 2016/0277145 A1* | 9/2016 | Grant | H04L 1/0041 |

OTHER PUBLICATIONS

Li, Zongwang et al., "An Improved Bit-Flipping Scheme to Achieve Run Length Control in Coded Systems", IEEE Transactions on Magnetics, Oct. 2005, pp. 2980-2982, vol. 41, No. 10.

Vasic, Bane et al., "Run-Length-Limited Low-Density Parity Check Codes Based on Deliberate Error Insertion", IEEE Transactions on Magnetics, May 2004, pp. 1738-1743, vol. 40, No. 3.

Zhai, Fengqin et al., "DC-Free Convolutional Codes and DC-Free Turbo Codes", IEEE, 2005, pp. 632-636.

* cited by examiner

SYSTEM AND METHOD FOR LINE CODING

CROSS-REFERENCE TO RELATED APPLICATION(S)

The present application claims priority to and the benefit of U.S. Provisional Application No. 62/292,519, filed Feb. 8, 2016, entitled "LINE CODE SCHEME", the entire content of which is incorporated herein by reference.

FIELD

One or more aspects of embodiments according to the present invention relate to serial data transmission, and more particularly to a system and method for employing a line code in a system for serial data transmission.

BACKGROUND

Serial data links are commonly used in various applications. In some such applications, long runs of consecutive identical digits may hamper clock recovery in a serial receiver, and significant DC imbalance may degrade the performance of analog front end circuits in the receiver. Coding schemes such as 8b/10b or 64b/66b may be used to limit the length of runs of consecutive identical digits and they may, depending on the characteristics of the data being transmitted, tend to reduce DC imbalance, but they add overhead in the form of extra bits. Scrambler based line codes may be used to avoid overhead and, again depending on the characteristics of the data being transmitted, they may improve the DC balance, and generally reduce the lengths of runs of consecutive identical digits, but in principle they may generate output with poor DC balance and unbounded runs of consecutive identical digits.

Thus, there is a need for an improved system and method for line coding.

SUMMARY

Aspects of embodiments of the present disclosure are directed toward a system and method for line coding of data. A serial transmitter includes a forward error correction encoding circuit followed by a bit conditioning circuit. The bit conditioning circuit counts the lengths of runs of consecutive identical digits and, when the count reaches a threshold, flips a bit. A serial receiver receives the data from the serial transmitter. The serial receiver includes a forward error correction decoding circuit, which re-flips bits flipped by the bit conditioning circuit of the serial transmitter.

According to an embodiment of the present invention there is provided a system including: a serial transmitter having a transmitter input and a transmitter output, the serial transmitter including: a forward error correction encoding circuit having an input connected to the transmitter input, and an output; and a bit conditioning circuit having an input connected to the output of the forward error correction encoding circuit, the bit conditioning circuit including a bit flipping circuit configured to selectively invert a current bit, the bit conditioning circuit being configured to limit, in data transmitted through the transmitter output, a maximum run length of consecutive identical bits.

In one embodiment, the bit conditioning circuit is further configured to limit a DC imbalance of the data transmitted through the transmitter output.

In one embodiment, the bit conditioning circuit further includes a continuous identical digit counting circuit configured: to count a number of continuous identical bits including the current bit, and to cause the bit flipping circuit to flip the current bit when the number of continuous identical bits including the current bit exceeds a first threshold.

In one embodiment, the bit conditioning circuit is further configured to limit a DC imbalance of the data transmitted through the transmitter output.

In one embodiment, the bit conditioning circuit further includes a running disparity counter configured: to keep a running count of the difference between the number of zero bits transmitted and the number of one bits transmitted, and to cause the bit flipping circuit to flip a bit when the running count exceeds a second threshold.

In one embodiment, the system includes a scrambling circuit connected between the output of the forward error correction encoding circuit and the input of the bit conditioning circuit.

In one embodiment, the system includes a parallel to serial converter.

In one embodiment, the system includes a framing circuit.

In one embodiment, the serial transmitter is configured to operate with a first data rate at the transmitter input and a second data rate at the transmitter output, the second data rate being the same as the first data rate.

According to an embodiment of the present invention there is provided a serial link, including: a serial transmitter having a transmitter input and a transmitter output; and a serial receiver having a receiver input connected to the serial transmitter through a serial channel; the serial transmitter including: a forward error correction encoding circuit having an input connected to the transmitter input, and an output; and a bit conditioning circuit having an input connected to the output of the forward error correction encoding circuit, the bit conditioning circuit including a bit flipping circuit configured to selectively invert a current bit, the bit conditioning circuit being configured to limit, in data transmitted through the transmitter output, a maximum run length of consecutive identical bits.

In one embodiment, the serial receiver includes a forward error correction decoding circuit.

In one embodiment, the bit conditioning circuit is further configured to limit a DC imbalance of the data transmitted through the transmitter output.

In one embodiment, the serial link includes the current bit, and to cause the bit flipping circuit to flip the current bit when the number of continuous identical bits including the current bit exceeds a first threshold.

In one embodiment, the bit conditioning circuit is further configured to limit a DC imbalance of the data transmitted through the transmitter output.

In one embodiment, the bit conditioning circuit further includes a running disparity counter configured: to keep a running count of the difference between the number of zero bits transmitted and the number of one bits transmitted, and to cause the bit flipping circuit to flip a bit when the running count exceeds a second threshold.

In one embodiment, the serial transmitter further includes a scrambling circuit connected between the output of the forward error correction encoding circuit and the input of the bit conditioning circuit, and the serial receiver further includes a descrambling circuit connected to an input of the forward error correction decoding circuit.

In one embodiment, the serial transmitter further includes a parallel to serial converter, and the serial receiver further includes a serial to parallel converter.

In one embodiment, the serial transmitter further includes a framing circuit, and the serial receiver further includes a deframing circuit.

In one embodiment, the serial transmitter is configured to operate with a first data rate at the transmitter input and a second data rate at the transmitter output, the second data rate being the same as the first data rate.

BRIEF DESCRIPTION OF THE DRAWINGS

These and other features and advantages of the present invention will be appreciated and understood with reference to the specification, claims, and appended drawings wherein:

DETAILED DESCRIPTION

The detailed description set forth below in connection with the appended drawings is intended as a description of exemplary embodiments of a system and method for line coding provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
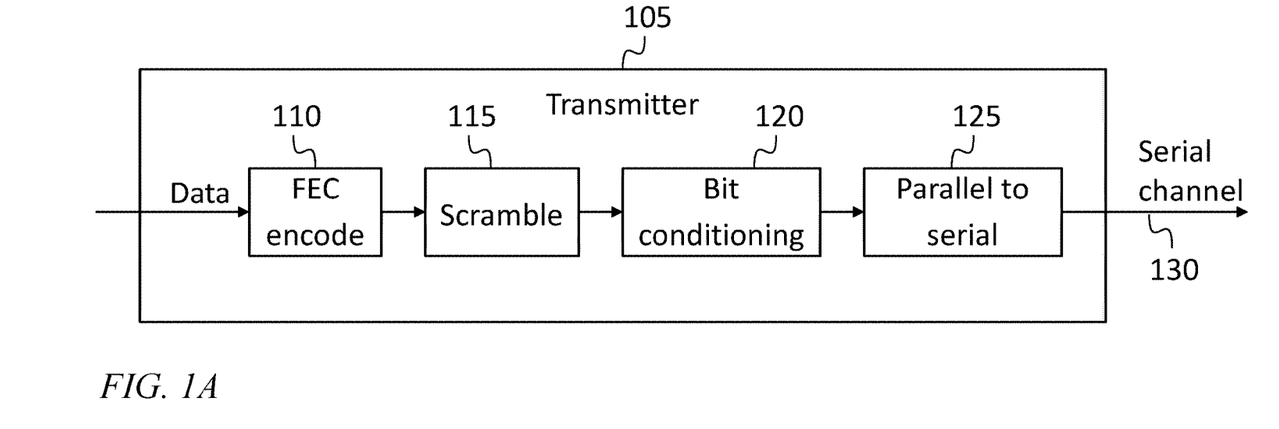
FIG. 1A is a block diagram of a serial transmitter, according to an embodiment of the present invention.

Referring to FIG. 1A, in some embodiments a serial transmitter 105 receives data (e.g., parallel data) from a source of data, encodes the data, in a forward error correction encoding circuit 110, scrambles the data in a scrambling circuit 115, flips zero or more of the bits in a bit conditioning circuit 120, converts the data to serial data in a parallel to serial converter 125, and transmits the data into a first end of a serial channel 130. The forward error correction encoding circuit 110 may implement, for example, Reed-Solomon encoding. The scrambling circuit 115 may for example be an additive scrambler or a multiplicative scrambler. An additive scrambler may include a linear feedback shift register (initialized with a non-zero value), each bit from the output of which may be combined, in an exclusive OR operation, with a respective bit of the data fed into the scrambler, to form the scrambler output data. A multiplicative scrambler may include a linear feedback shift register; each bit of the input to the scrambler may be combined, in an exclusive OR operation, with a respective bit of the data from the feedback network of the linear feedback shift register, and fed (i) into the shift register and (ii) to the output of the scrambler. The parallel to serial converter 125 may be a suitably connected shift register.

The bit conditioning circuit 120 may be used to limit runs of consecutive identical digits (i.e., runs of consecutive identical bits), and to limit the DC imbalance of the transmitted signal, by flipping certain bits of the data stream, as described in further detail below. The serial channel 130 may be any channel suitable for transmitting serial data, such as a pair of conductors, an optical fiber, or other like channels or combinations of such channels. The serial channel 130 may include suitable converters (e.g., optical transmitters and receivers for converting between electrical and optical signals).

Figure 1B:
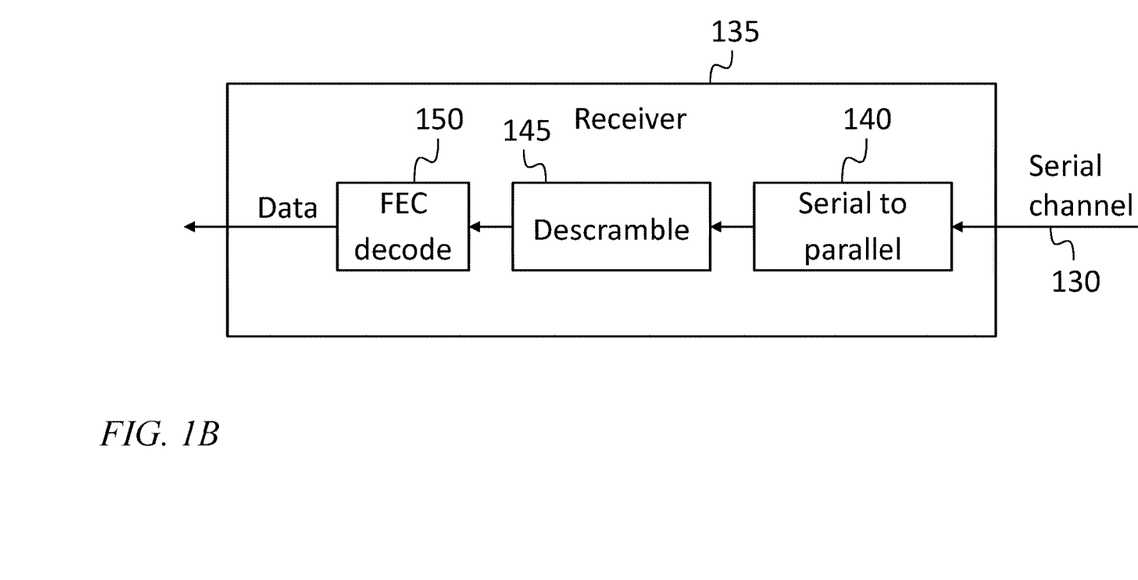
FIG. 1B is a block diagram of a serial receiver, according to an embodiment of the present invention.

Referring to FIG. 1B, a second end of the serial channel 130 may be connected to a serial receiver 135. The serial receiver may include a serial to parallel converter 140 which converts the received serial data to parallel format, a descrambling circuit 145 which reverses the effects of the scrambling circuit 115, and a forward error correction decoding circuit 150, which reverses the coding applied by the forward error correction encoding circuit 110, and corrects errors and re-flips bits flipped by the bit conditioning circuit 120. The forward error correction decoding circuit 150 may treat bits flipped by the bit conditioning circuit 120 in the same manner as it treats bits flipped by other mechanisms (e.g., noise in the serial channel 130). The type of forward error correction code used may determine the capacity of the forward error correction decoding circuit 150 to correct errors and to re-flip flip bits, e.g., it may determine the maximum fraction of flipped received bits (e.g., flipped as a result of noise, or of bit flips introduced by the bit conditioning circuit 120) for which it is feasible to reproduce, at the output of the receiver 135, the data received by the transmitter 105.

Figure 2A:
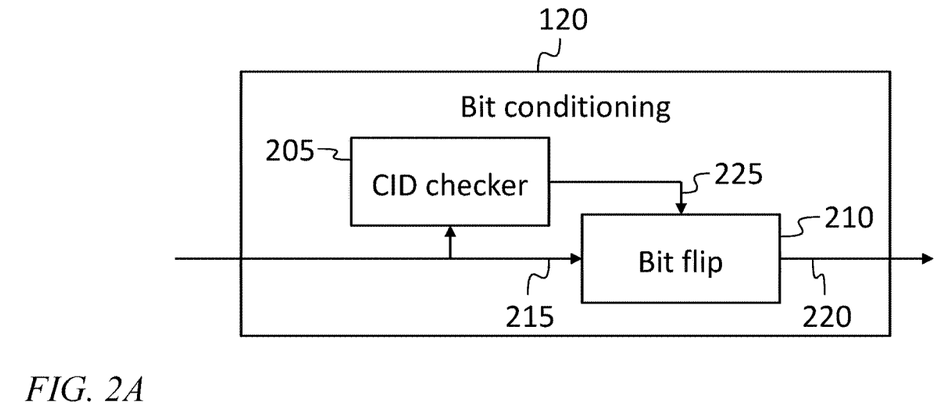
FIG. 2A is a block diagram of a bit conditioning circuit, according to an embodiment of the present invention.

Referring to FIG. 2A, in one embodiment, the bit conditioning circuit 120 includes a continuous identical digit counting circuit 205 and a bit flipping circuit 210 configured to selectively invert a current bit. The continuous identical digit counting circuit 205 may count the number of continuous identical digits, resetting the count to one when it receives a one preceded by a zero or a zero preceded by a one. The bit flipping circuit 210 may be a circuit with a data input 215, a data output 220, and a control input 225, that, when it receives a certain signal at the control input 225, flips the current bit, i.e., produces an output bit at the data output 220 that is the opposite of the bit received at the data input 215. The bit flipping circuit 210 may be implemented as an exclusive OR gate, for example, with the data input 215 and the control input 225 being the two inputs of the exclusive OR gate and the data output 220 being the output of the exclusive OR gate.

In operation, the continuous identical digit counting circuit 205 of the bit conditioning circuit 120 counts the lengths of runs of consecutive identical digits, and flips the last bit (by suitable control of the bit flipping circuit 210) of the current run of consecutive identical digits whenever the length of the current run of consecutive identical digits reaches a threshold, thereby limiting the run length to one less than the threshold. If, for example, the threshold is 81, then when the continuous identical digit counting circuit 205 has counted 81 consecutive ones, it flips the last bit of the run (i.e., it changes the $81^{st}$ one to a zero), so that the length of the run at the output of the bit conditioning circuit 120 is 80. The continuous identical digit counting circuit 205 includes in the run length count any bit that has been flipped.

In the example above, if the one that was changed to a zero is followed by another 80 zeros, the continuous identical digit counting circuit 205 will count the run of zeros as a run of 81 zeros, and flip (i.e., change) the $81^{st}$ zero to a one. The continuous identical digit counting circuit 205 is shown in FIG. 2A as being connected to the data input 215 of the bit flipping circuit 210; in some embodiments it is connected instead to the data output 220, with internal circuitry correspondingly altered to achieve the effect described above.

Figure 2B:
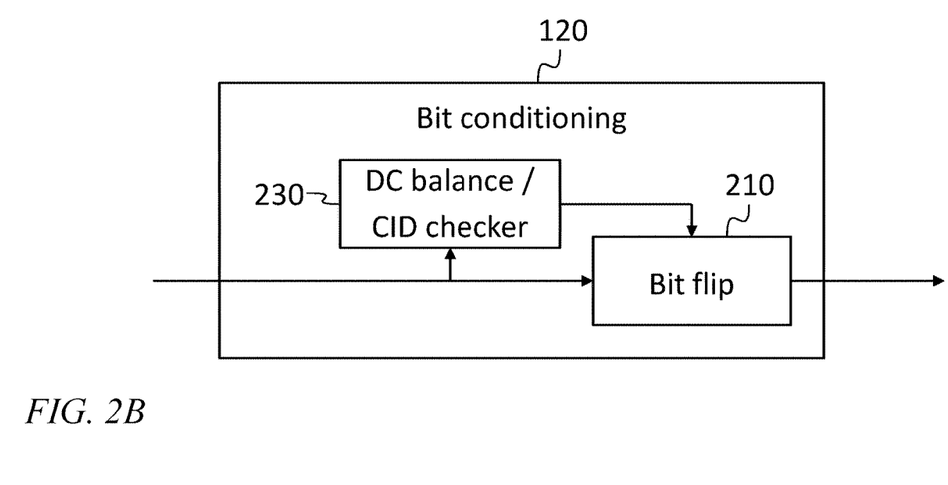
FIG. 2B is a block diagram of a bit conditioning circuit, according to an embodiment of the present invention.

A serial transmitter 105 using a scrambling circuit 115 and using the bit conditioning circuit 120 of FIG. 2A may have statistically lower DC imbalance than the data stream at the input of the scrambler, because for input data that are heavily biased toward a value of zero or one (e.g., a data stream carrying a dark image, in which many of the pixel values are near zero) (i) the scrambling circuit 115 may map the data to a pseudorandom mix of ones and zeros and (ii) long runs may be more common in the more common data value, resulting in a larger number of bit flips to the less common data value (e.g., data consisting predominantly of zeros may include more runs of zeros and therefore trigger more flips from zero to one, than from one to zero). The tendency of the bit conditioning circuit 120 to reduce the DC imbalance may be enhanced by replacing the continuous identical digit counting circuit 205 with a bit conditioning control circuit 230 including a running disparity counter in addition to, or instead of, a continuous identical digit counting circuit 205. The running disparity counter may count (starting, e.g., at startup or reset) the difference between the total number of zeros transmitted and the total number of ones transmitted; this count is referred to herein as the running disparity count. The running disparity counter may be implemented, for example, as a signed up/down counter that counts up when a one is transmitted and counts down when a zero is transmitted. The running disparity counter may cause the bit flipping circuit 210 to flip the current bit whenever the running disparity count, including the current bit, reaches a threshold.

The running disparity counter takes any such flipped bits into account. for example, if the current bit is a one and the current running disparity count (including the current bit) is 81, and the running disparity counter causes the bit flipping circuit 210 to flip the current bit (e.g., because the threshold is 81), then the running disparity count is corrected, when the bit is flipped, to 79.

The bit conditioning control circuit 230 may include both a running disparity counter and a continuous identical digit counting circuit 205, and it may be configured so that both the running disparity counter and the continuous identical digit counting circuit 205 are capable of causing the bit flipping circuit 210 to flip the current bit, when either of two corresponding thresholds is exceeded in the respective one of the running disparity counter and the continuous identical digit counting circuit 205. For example, if both thresholds are 81, then a series of input bits consisting of 50 ones, followed by 10 zeros, followed by 41 ones may cause the running disparity counter to cause a bit flip, and a series of input bits consisting of 50 zeros followed by 81 ones may cause the continuous identical digit counting circuit 205 to cause a bit flip. The bit conditioning control circuit 230 is shown in FIG. 2B as being connected to the data input 215 of the bit flipping circuit 210; in some embodiments it is connected instead to the data output 220, with internal circuitry correspondingly altered to achieve the effect described above.

Embodiments such as those described above may have several advantages over alternative related art line coding approaches (such as 64b/66b coding) including that the data rate at the output of the serial transmitter 105 is the same as that at the input of the serial transmitter 105.

Figure 3A:
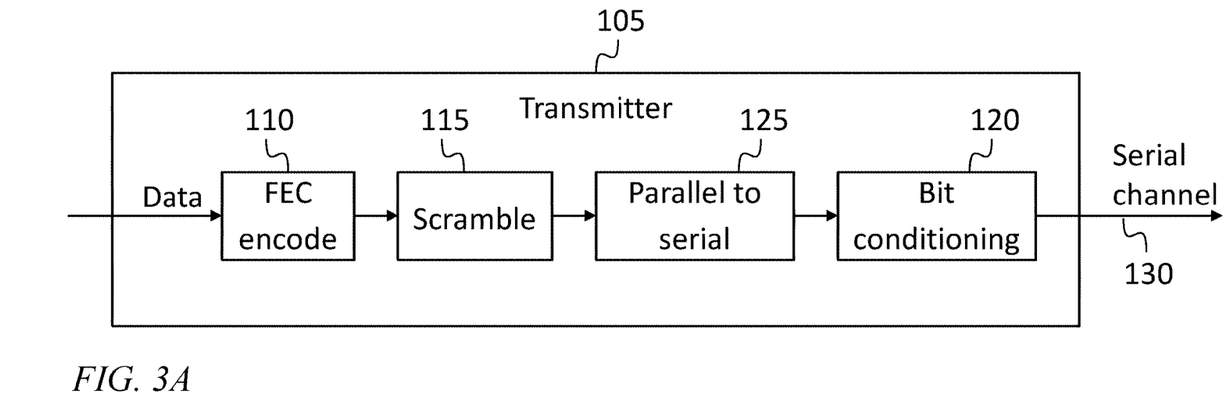
FIG. 3A is a block diagram of a serial transmitter, according to an embodiment of the present invention.
Figure 3B:
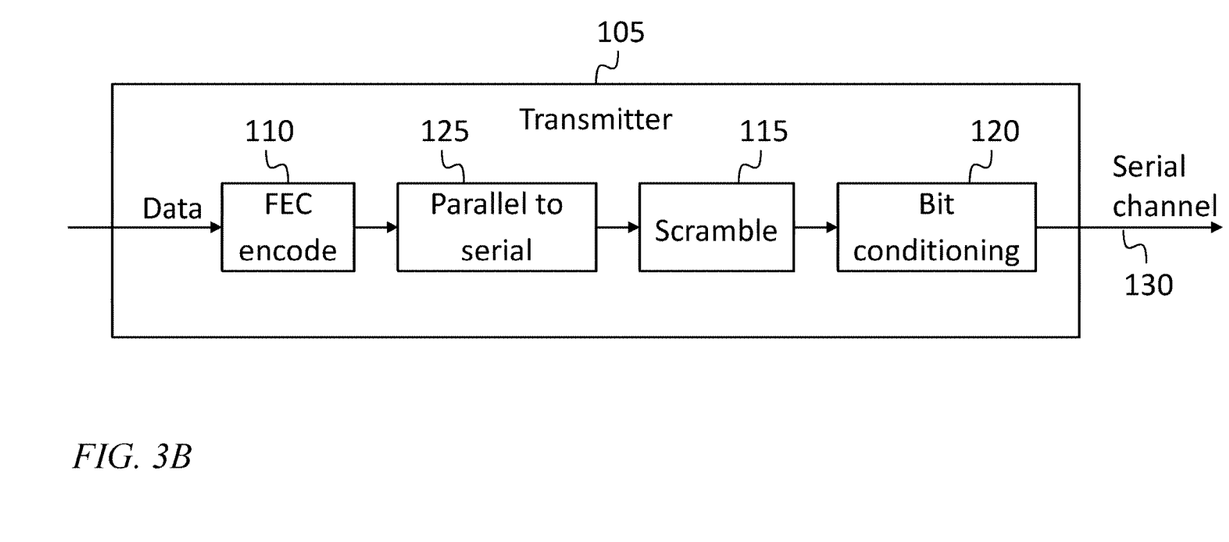
FIG. 3B is a block diagram of a serial transmitter, according to an embodiment of the present invention.
Figure 3C:
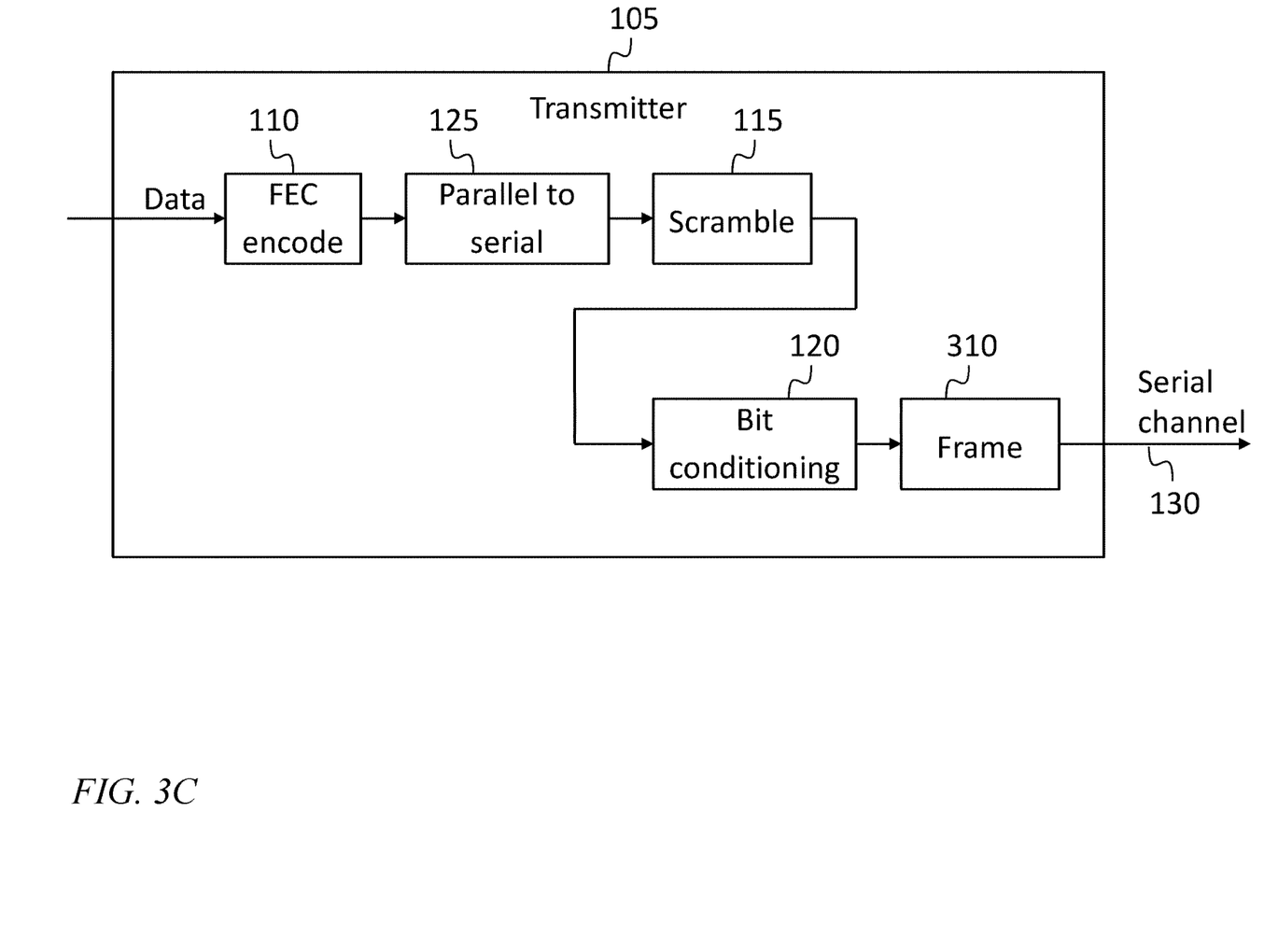
FIG. 3C is a block diagram of a serial transmitter, according to an embodiment of the present invention.
Figure 4A:
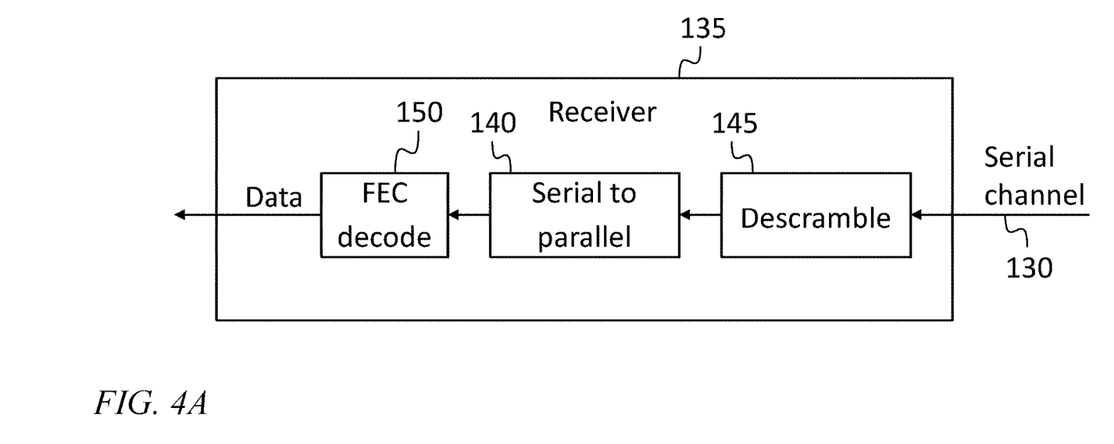
FIG. 4A is a block diagram of a serial receiver, according to an embodiment of the present invention.
Figure 4B:
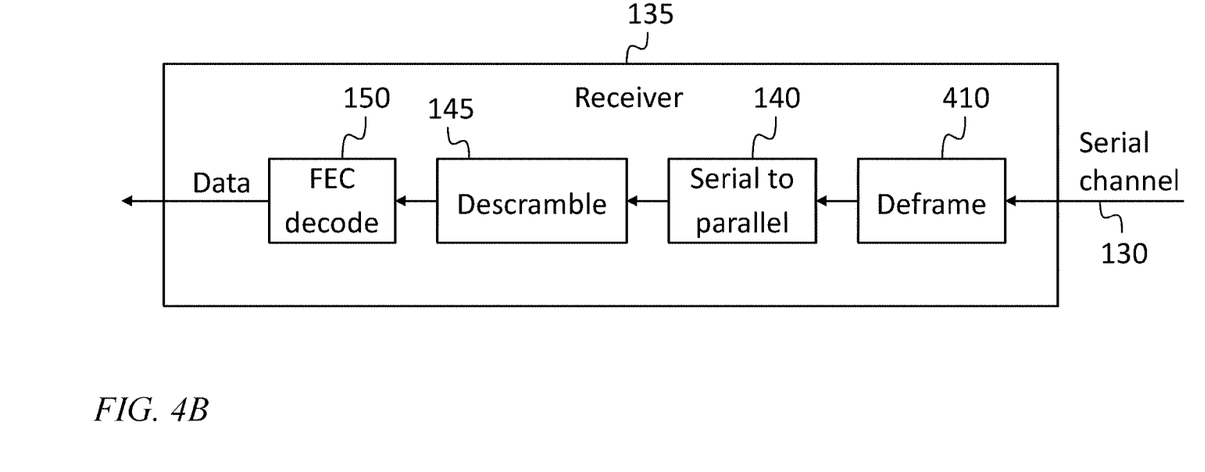
FIG. 4B is a block diagram of a serial receiver, according to an embodiment of the present invention.

One of skill in the art will recognize that some of the elements of FIGS. 1A and 1B may be absent or may be connected in a different order, or that additional elements may be included. For example, the parallel to serial converter 125 may precede the bit conditioning circuit 120 as illustrated in FIG. 3A, or it may precede the bit conditioning circuit 120 and the scrambling circuit 115, as shown in FIG. 3B (and, accordingly, the bit conditioning circuit 120 and/or the scrambling circuit 115 may operate on serial data). A framing circuit 310 may be present at any point in the serial transmitter 105 as shown, for example, in FIG. 3C. If the framing circuit follows the forward error correction encoding circuit 110 and the bit conditioning circuit 120 as shown in FIG. 3C, a framing method that is bit-error-tolerant may be used, and the thresholds for DC balance and for the length of runs of consecutive identical digits may be chosen so that the characteristics of the transmitted serial bit stream will be acceptable taking into account any effect the framing may have on runs of consecutive identical digits and on DC balance. Similarly, in the receiver, the descrambling circuit 145 may precede the serial to parallel converter 140 as shown in FIG. 4A (and the descrambling circuit 145 may operate on parallel data). When the transmitter includes a framing circuit 310 (as shown for example in FIG. 3C) the receiver may include a corresponding deframing circuit 410 as shown in FIG. 4B.

It will be understood that when an element is referred to as being "connected to", or "coupled to" another element, it may be directly connected to, or coupled to, the other element, or one or more intervening elements may be present. In contrast, when an element is referred to as being "directly connected to" or "directly coupled to" another element, there are no intervening elements present.

Although exemplary embodiments of a system and method for line coding have been specifically described and illustrated herein, many modifications and variations will be apparent to those skilled in the art. Accordingly, it is to be understood that a system and method for line coding constructed according to principles of this invention may be embodied other than as specifically described herein. The invention is also defined in the following claims, and equivalents thereof.

What is claimed is:

1. A system comprising:
  a serial transmitter having a transmitter input and a transmitter output, the serial transmitter comprising:
    a forward error correction encoding circuit having an input connected to the transmitter input, and an output; and
    a bit conditioning circuit having an input connected to the output of the forward error correction encoding circuit, the bit conditioning circuit comprising a bit flipping circuit configured to selectively invert a current bit, the bit conditioning circuit being configured to limit, in data transmitted through the transmitter output, a maximum run length of consecutive identical bits,
  wherein the bit conditioning circuit further comprises a continuous identical digit counting circuit configured:
    to count a number of continuous identical bits including the current bit, and
    to cause the bit flipping circuit to flip the current bit when the number of continuous identical bits including the current bit exceeds a first threshold, wherein the bit conditioning circuit is further configured to limit a DC imbalance of the data transmitted through the transmitter output, and wherein the bit conditioning circuit further comprises a running disparity counter configured:
- to keep a running count of the difference between the number of zero bits transmitted and the number of one bits transmitted, and
- to cause the bit flipping circuit to flip a bit when the running count exceeds a second threshold.

2. The system of claim 1, further comprising a scrambling circuit connected between the output of the forward error correction encoding circuit and the input of the bit conditioning circuit.

3. The system of claim 1, further comprising a parallel to serial converter.

4. The system of claim 1, further comprising a framing circuit.

5. The system of claim 1, wherein the serial transmitter is configured to operate with a first data rate at the transmitter input and a second data rate at the transmitter output, the second data rate being the same as the first data rate.

6. A serial link, comprising:
- a serial transmitter having a transmitter input and a transmitter output; and
- a serial receiver having a receiver input connected to the serial transmitter through a serial channel;
- the serial transmitter comprising:
  - a forward error correction encoding circuit having an input connected to the transmitter input, and an output; and
  - a bit conditioning circuit having an input connected to the output of the forward error correction encoding circuit, the bit conditioning circuit comprising a bit flipping circuit configured to selectively invert a current bit, the bit conditioning circuit being configured to limit, in data transmitted through the transmitter output, a maximum run length of consecutive identical bits,
- wherein the serial receiver comprises a forward error correction decoding circuit, wherein the bit conditioning circuit further comprises a continuous identical digit counting circuit configured:
- to count a number of continuous identical bits including the current bit, and
- to cause the bit flipping circuit to flip the current bit when the number of continuous identical bits including the current bit exceeds a first threshold, wherein the bit conditioning circuit is further configured to limit a DC imbalance of the data transmitted through the transmitter output, and wherein the bit conditioning circuit further comprises a running disparity counter configured:
- to keep a running count of the difference between the number of zero bits transmitted and the number of one bits transmitted, and
- to cause the bit flipping circuit to flip a bit when the running count exceeds a second threshold.

7. The serial link of claim 6, wherein:
the serial transmitter further comprises a scrambling circuit connected between the output of the forward error correction encoding circuit and the input of the bit conditioning circuit, and
the serial receiver further comprises a descrambling circuit connected to an input of the forward error correction decoding circuit.

8. The serial link of claim 6, wherein:
the serial transmitter further comprises a parallel to serial converter, and
the serial receiver further comprises a serial to parallel converter.

9. The serial link of claim 6, wherein:
the serial transmitter further comprises a framing circuit, and
the serial receiver further comprises a deframing circuit.

10. The serial link of claim 6, wherein the serial transmitter is configured to operate with a first data rate at the transmitter input and a second data rate at the transmitter output, the second data rate being the same as the first data rate.

* * * * *